United States Patent [19]
Rose et al.

[11] Patent Number: 5,567,329
[45] Date of Patent: Oct. 22, 1996

[54] METHOD AND SYSTEM FOR FABRICATING A MULTILAYER LAMINATE FOR A PRINTED WIRING BOARD, AND A PRINTED WIRING BOARD FORMED THEREBY

[75] Inventors: Paul B. Rose; John L. Lamanna, both of Winter Park, Fla.

[73] Assignee: Martin Marietta Corporation, Bethesda, Md.

[21] Appl. No.: 379,252

[22] Filed: Jan. 27, 1995

[51] Int. Cl.⁶ .................................................. B44C 1/22
[52] U.S. Cl. .............................. 216/18; 216/65; 156/345
[58] Field of Search ................................ 216/17, 18, 39, 216/41, 65, 72, 78, 105; 219/121.68, 121.69, 121.85; 428/209; 29/852, 884; 156/345

[56] References Cited

U.S. PATENT DOCUMENTS

| | | |
|---|---|---|
| 3,311,966 | 4/1967 | Shaheen et al. ............... 216/18 X |
| 4,425,380 | 1/1984 | Nuzzi et al. . |
| 4,642,160 | 2/1987 | Burgess ............................ 216/18 |
| 4,764,485 | 8/1988 | Loughran et al. . |
| 4,894,115 | 1/1990 | Eichelberger et al. . |
| 4,904,340 | 2/1990 | Miracky et al. . |
| 4,915,981 | 4/1990 | Traskos et al. . |
| 4,959,119 | 9/1990 | Lantzer . |
| 4,980,034 | 12/1990 | Volfson et al. . |
| 4,983,250 | 1/1991 | Pan . |
| 5,093,279 | 3/1992 | Andreshak et al. . |
| 5,104,480 | 4/1992 | Wojnarowski et al. . |
| 5,169,678 | 12/1992 | Cole et al. . |
| 5,169,800 | 12/1992 | Kobayashi . |
| 5,221,426 | 6/1993 | Tessier et al. . |
| 5,236,551 | 8/1993 | Pan . |

Primary Examiner—William Powell
Attorney, Agent, or Firm—Burns, Doane, Swecker & Mathis, L.L.P.

[57] ABSTRACT

In a method of fabricating a multilayer laminate for a printed wiring board, a plurality of blind via sites are etched from a first side of a first sheet, the first sheet including a flexible dielectric material, the flexible material being clad on the first and a second side with first and second layers of conductive material, respectively, through the first conductive material and the flexible material to the second conductive material. Conductive material posts are electroplated in the blind via sites, using the second layer of conductive material as an electrode. A system for fabricating a multilayer laminate for a printed wiring board and a multilayer laminate for a printed wiring board formed thereby is also disclosed.

29 Claims, 6 Drawing Sheets ns 5,567,329

METHOD AND SYSTEM FOR FABRICATING A MULTILAYER LAMINATE FOR A PRINTED WIRING BOARD, AND A PRINTED WIRING BOARD FORMED THEREBY

FIELD OF THE INVENTION

The present invention relates to a method and system for fabricating a printed wiring board, and to a printed wiring board formed thereby.

BACKGROUND AND SUMMARY

Printed circuits are used in a wide variety of electronic equipment and utilize graphic technologies to achieve a great advantage in the size, weight, and cost of equipment compared to conventional wiring arrangements. Typically, an enlarged-scale artwork master of a circuit pattern of circuit elements and conductor paths is first prepared, and then the enlarged-scale artwork master is photographically reduced to the desired size. Screens and masks are fabricated according to the reduced master of the circuit pattern for the application of photoresistive materials to circuit board layers. Processes including etching, screening, plating, laminating, vacuum deposition, diffusion, and application of protective coatings are used to provide printed circuits.

Multilayer printed wiring boards are often used in applications requiring increased circuit density, and facilitate the provision of additional leads to an electrical component. Conductors are located on several insulated internal layers. Common multilayer circuits include a number of two-sided etched copper foil boards, separated by an insulating layer and laminated together under controlled temperature, pressure, and time.

Several techniques are known for electrically interconnecting the conductors on multiple layers of the multilayer printed wiring boards. According to one technique, a hole or "via" is drilled through the multilayer board from one side to the other. The drilled cylindrical surface is plated by a chemical deposition process and then electroplated to form the interconnections between layers or mountings for electronic parts.

U.S. Pat. No. 4,980,034 provides a general overview of other conventional methods, e.g., subtractive, semi-additive, and additive methods, used in fabricating multilayer interconnects and further discloses a "modified semi-additive" process. In the process disclosed in U.S. Pat. No. 4,980,034, a chromium protective layer is deposited on a silicon substrate and is patterned. A continuous copper layer is deposited over the patterned chromium layer, and a protective chromium overcoat covers the copper layer. A dielectric is applied over the overcoat; openings extending to the copper layer are etched in the dielectric and the overcoat; and via posts are plated in the openings using the copper layer as a cathode. Second bottom protective layers, conductive layers, and top protective layers are deposited over the dielectric and patterned, and the process of applying a dielectric, etching openings, plating via holes using the immediately preceding conductive layer as a cathode, and depositing and patterning further protective and conductive layers is repeated until a desired number of patterned conductive layers are provided. The substrate is removed, e.g., by etching, and the initial conductive layer and the overcoat is etched, the patterned protective layer preventing etching of the unexposed areas of the conductive layer, thereby creating a flex circuit. The flex circuit may then be bonded to another substrate.

Conventional methods for forming interconnects have various drawbacks. Techniques involving drilling holes for vias are, of course, subject to mechanical limitations. As discussed in U.S. Pat. No. 4,980,034, subtractive techniques result in vias having sloped sides, requiring more area; the vias may have to be laterally offset, requiring more area, reducing heat transfer, and extending the conductive path; and design rules become complex. Semi-additive processes involve many steps and require a planarization process to expose vias and, in additive processes, it is difficult to control via uniformity. In the process described in U.S. Pat. No. 4,980,034, laser etching of the vias through the dielectric must be performed one via at a time, resulting in a time-consuming process. Further, vapor deposition process steps are costly, and it is necessary to discard the substrate prior to etching the bottom circuit pattern.

It is, accordingly, desirable to provide a method that permits efficiently forming uniform, straight sided, vertically stacked vias in a multilayer printed wiring board, without the need for vapor deposition or mechanical processing such as drilling or planarization. It is further desirable to provide a system for performing the method.

In accordance with one aspect of the present invention, a method of fabricating a multilayer laminate for a printed wiring board is disclosed. According to the method, a photoimage of a plurality of blind via sites is developed, with photoimaging material, on a first side of a first sheet, the first sheet including a flexible dielectric material, the flexible material being clad on the first and a second side with first and second layers of conductive material, respectively. Conductive material of the first layer of conductive material is etched from the blind via sites. Developed photoimaging material of the photoimage of the blind via sites is removed. The flexible material is laser ablated from the blind via sites. A photoimage of a conductor and pad pattern is developed, with photoimaging material, on the first side of the first sheet. Conductive material posts are electroplated in the blind via sites, using the second layer of conductive material as an electrode. Conductive material is electroplated in the conductor and pad pattern on the first side of the first sheet. A protective material is electroplated in the conductor and pad pattern over the conductive material electroplated in the conductor and pad pattern on the first side of the first sheet. Developed photoimaging material of the photoimage of the conductor and pad pattern is removed. The first side of the first sheet is etched to remove the photoimaged pattern and exposed conductive material of the first layer of conductive material beneath the photoimaged pattern, thereby forming a patterned first sheet. The protective material is removed. Steps of bonding a first side of a second sheet, the second sheet including a flexible material clad on a second side with a first layer of conductive material, to an etched first side of a preceding sheet, followed by a patterning operation for each additional layer of conductive material desired, are repeated, thereby forming the multilayer laminate.

In accordance with another aspect of the present invention, a method of fabricating a multilayer laminate for a printed wiring board is disclosed. According to the method, a plurality of blind via sites is etched from a first side of a first sheet, the first sheet including a flexible dielectric material, the flexible material being clad on the first and a second side with first and second layers of conductive material, respectively, through the first conductive material and the flexible material to the second conductive material.

Conductive material posts are electroplated in the blind via sites, using the second layer of conductive material as an electrode.

In accordance with another aspect of the present invention, a system for fabricating a multilayer laminate for a printed wiring board is disclosed. The system includes means for forming a photoimage of a plurality of blind via sites on a first side of a first sheet, the first sheet including a flexible dielectric material, the flexible material being clad on the first and a second side with first and second layers of conductive material, respectively. Means are also provided for etching conductive material from the blind via sites. A laser is provided for ablating the flexible material from the blind via sites. Means are provided for forming a photoimage of a conductor and pad pattern on the first side of the first sheet after laser etching. Means are provided for electroplating conductive material posts in the blind via sites after laser etching, using the second layer of conductive material as an electrode, and for electroplating conductive material in the conductor and pad pattern on the first side of the first sheet after electroplating the conductive material posts. Means are provided for electroplating a protective material in the conductor and pad pattern over the conductive material electroplated in the conductor and pad pattern on the first side of the first sheet. Means are also provided for etching the first side of the first sheet to remove the photoimaged pattern and exposed conductive material of the first layer of conductive material beneath the photoimaged pattern, thereby forming a patterned first sheet.

In accordance with another aspect of the present invention, a system for fabricating a multilayer laminate for a printed wiring board is disclosed. The system includes means for forming a photoimage of a plurality of blind via sites on a first side of a first sheet, the first sheet including a flexible dielectric material, the flexible material being clad on the first and a second side with first and second layers of conductive material, respectively. Means are provided for etching conductive material from the blind via sites. Means are provided for laser ablating the flexible material from the blind via sites. Means are also provided for electroplating conductive material posts in the blind via sites after laser ablating, using the second layer of conductive material as an electrode.

In accordance with yet another aspect of the present invention, a multilayer laminate for a printed wiring board is disclosed. The multilayer laminate includes a first sheet, the first sheet including a flexible dielectric material, the flexible material being clad on a first and a second side with first and second layers of conductive material, respectively. The multilayer laminate further includes blind via sites extending through the first layer of conductive material and the flexible material to the second layer of conductive material, and conductive material posts electroplated in the blind via sites by using the second layer of conductive material as an electrode.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION

Figure 1A:
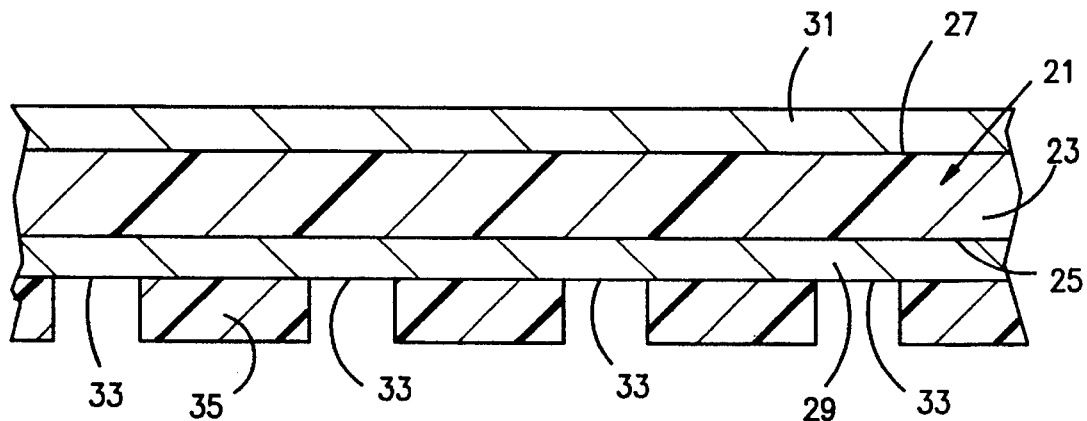
FIGS. 1A–1K are side cross-sectional schematic views of an exemplary series of method steps for making a multilayer printed wiring board according to an embodiment of the present invention, and the article produced thereby.

FIGS. 1A–1K show an exemplary series of method steps for making a high density, multilayer printed wiring board according to the present invention. As seen in FIG. 1A, the method begins with a sheet 21, the sheet including a layer 23 of an unreinforced, flexible dielectric material, preferably a polyimide film, the layer 23 being clad on first and second sides 25 and 27 with first and second layers 29 and 31 of a conductive material, preferably copper. A presently preferred sheet 21 includes a dielectric layer 23 that is 0.002" thick and is clad on the first and second sides 25 and 27 with first and second layers 29 and 31 of copper, each 0.0007" thick. The sheet 21 may be a sheet of FLEX-I-MID, manufactured by Rogers Corp., Circuit Materials Division, Chandler, Ariz. A plurality of photoimaged blind via sites 33 are developed on the first conductive layer 29 in a conventional manner with a suitable photoimaging material 35, i.e., artwork is placed over photoresist, emulsion side down, and the photoresist is exposed through the artwork using a high intensity U.V. light source. Suitable artwork film is Kodak Precision Line Film, Pelicula, from the Eastman Kodak Co., Rochester, N.Y. A suitable photoimaging material 35 is DuPont Riston Photopolymer film, HR-110 series, available from DuPont Electronics, Wilmington, Del.

Figure 1B:
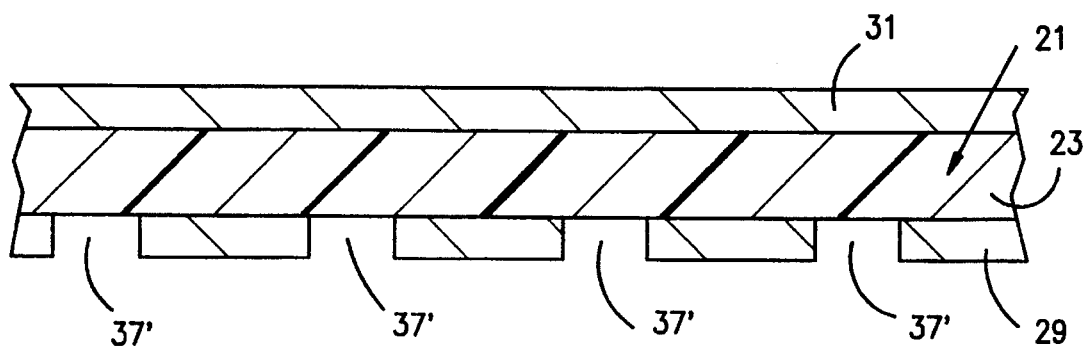
Figure 1C:
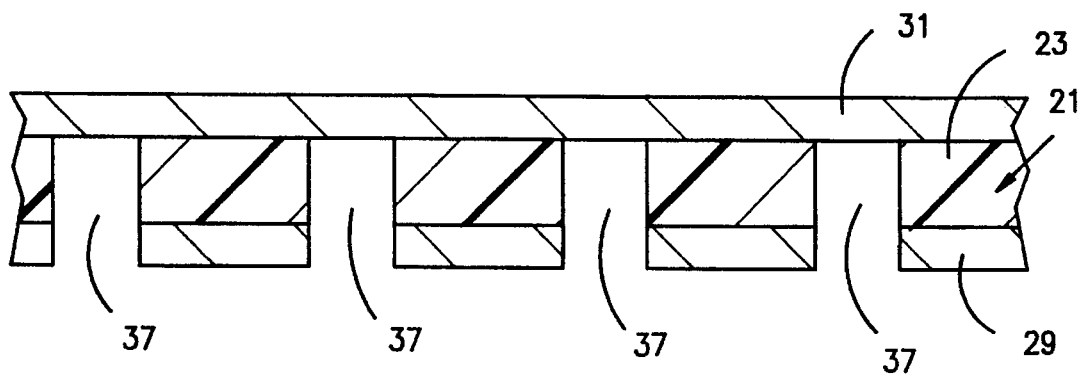

As seen in FIG. 1B, after developing the photoimaged blind via sites 33, the first conductive layer 29 is etched with a suitable enchant to form a portion 37' of a blind via site 37 extending to the dielectric layer 23. A suitable enchant is an ammoniacal copper etchant such as Hunt High Speed Ac-Cu-Guard, available from Olin Corp., Stamford, Conn. The etchant does not attack the dielectric layer 23. The etchant chemistry is preferably configured to be semi-anisotropic so that, with copper thicknesses on the order of 0.0007", vertical side walls are obtained. The photoresist is then removed using commercially available stripping solution, such as a 3% potassium hydroxide solution. As seen in FIG. 1C, the dielectric layer 23 is then ablated with a laser (not shown) to completely form the blind via sites 37 extending to the second layer of conductive material 31. The laser is preferably not powerful enough to ablate the conductive layers 29 or 31, thereby facilitating use of a scanning-type laser, capable of ablating multiple openings over a relatively large area, e.g., ⅛" by ¼", at one time. The blind via sites are preferably less than 0.004" in diameter, and are most preferably approximately 0.003" in diameter. By the present invention, spacing between vias may be quite small, e.g., on the order of 0.007" apart, thereby permitting very high routing densities.

Figure 1D:
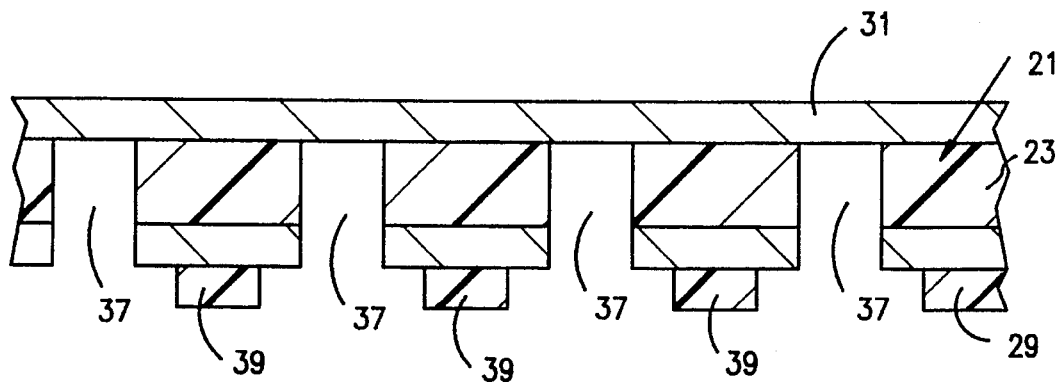
Figure 1E:
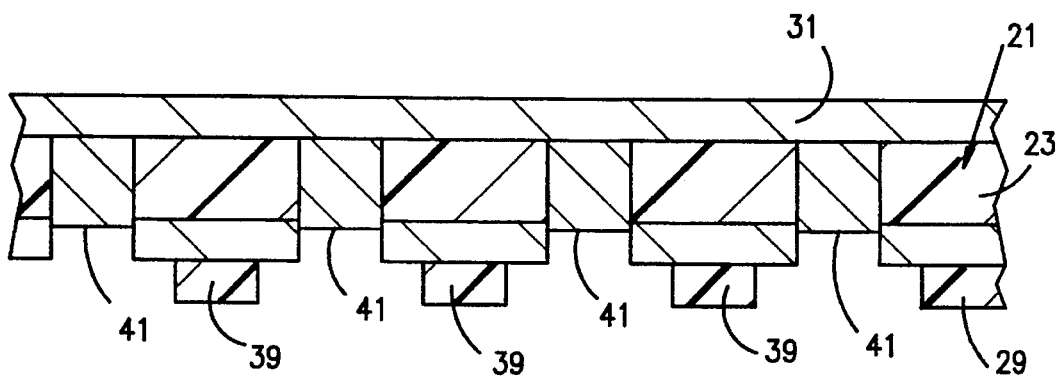

As seen in FIG. 1D, a photoimaged conductor and pad pattern 39 is developed on the first conductive layer 29 after the blind via sites 37 have been ablated. Next, as seen in FIG. 1E, conductive material posts 41 formed of the same material as the conductive layers 29 and 31, i.e., preferably copper, are electroplated in the blind via sites 37, using the second conductive layer 31 as an electrode, thereby improving fine line etching capability in comparison to electroless plating techniques, and avoiding problems such as air entrapment in blind vias. The electroplating of the posts 41 proceeds until the conductive material of the posts reaches the first conductive layer 29, at which time additional power is supplied to electroplate a conductor and pad pattern 43, seen in FIG. 1F, on areas of the first conductive layer not covered by the material of the photoimaged conductor and pad pattern 39.

Figure 1F:
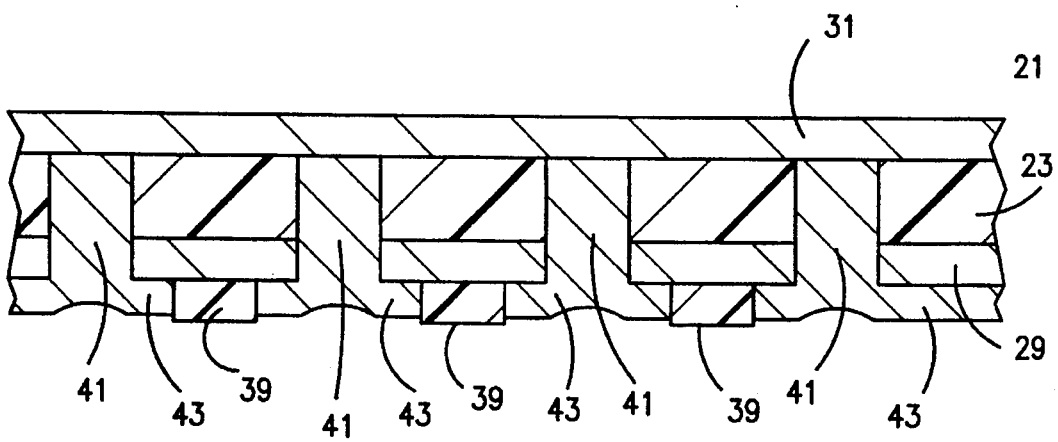
Figure 1G:
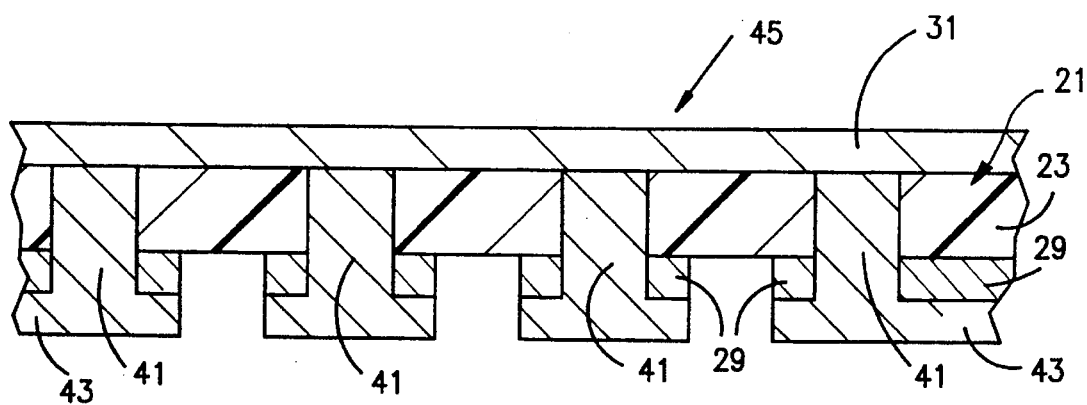

A protective layer (not shown), preferably a well-known tin/lead material such as Plutin LA tin/lead, available from Lea Ronal, 272 Buffalo Ave., Freeport, N.Y., is electroplated over the conductor and pad pattern 43. The photoresist is stripped using a commercially available stripping solution. As seen in FIG. 1G, the photoimaged conductor and pad pattern 39 and exposed conductive material of the first conductive layer 29 beneath the photoimaged conductor and pad pattern are etched away, leaving the conductor and pad pattern 43, thereby forming a patterned first sheet 45. The tin/lead protective layer is removed using commercially available solder stripping chemical solution, such as Ardrox PC 1125/Ardrox PC 1144 (two part, two step stripper), available from Ardrox Inc., Salem, N.H.

Figure 1H:
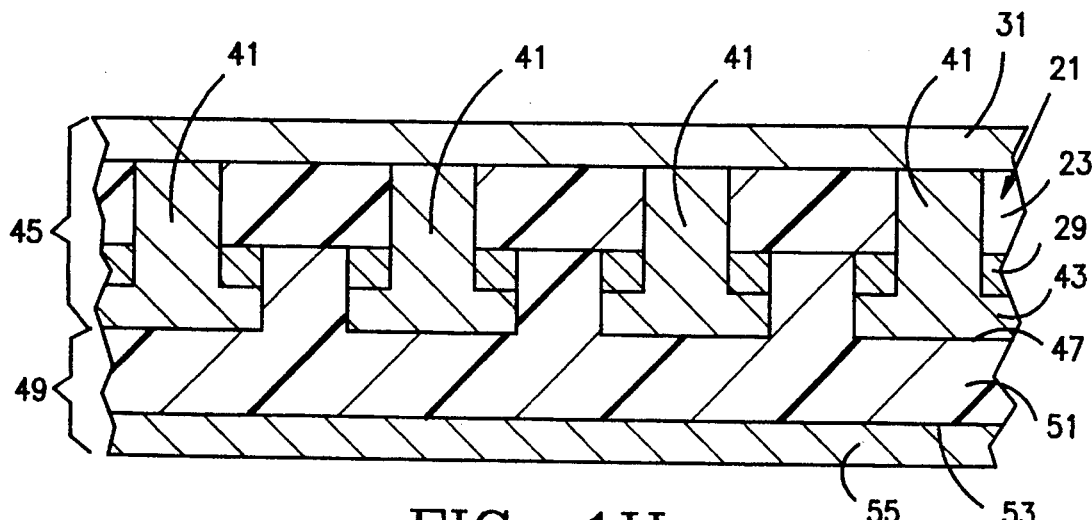

To form additional patterned conductive layers on the patterned first sheet 45, a first side 47 of a second sheet 49, the second sheet including a flexible dielectric material layer 51 clad on a second side 53 with a first layer of conductive material 55, is bonded over the conductor and pad pattern 43 as seen in FIG. 1H. Bonding material and/or the second sheet 49 preferably conforms to minor surface irregularities, i.e., bumps and recesses, on the conductor and pad pattern 43 to avoid trapped air.

Figure 1I:
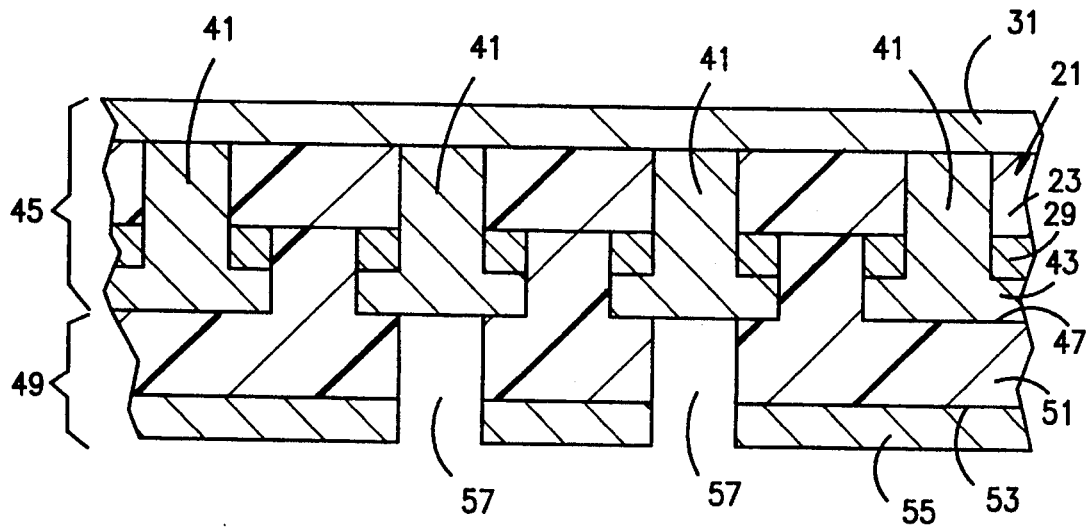

The method of forming via sites, posts, and a conductor and pad pattern described above with regard to the patterned first sheet is repeated on the second sheet 49. As seen in FIG. 1I, via sites 57 are etched through the conductive material 55 and ablated through the dielectric layer 51. A photoimaged conductor and pad pattern (not shown) is developed on the conductive material 55. Conductive posts 59 are electroplated in the via sites 57 by using the second conductive layer 31, and also using the patterned first conductive layer 29, as an electrode.

Figure 1J:
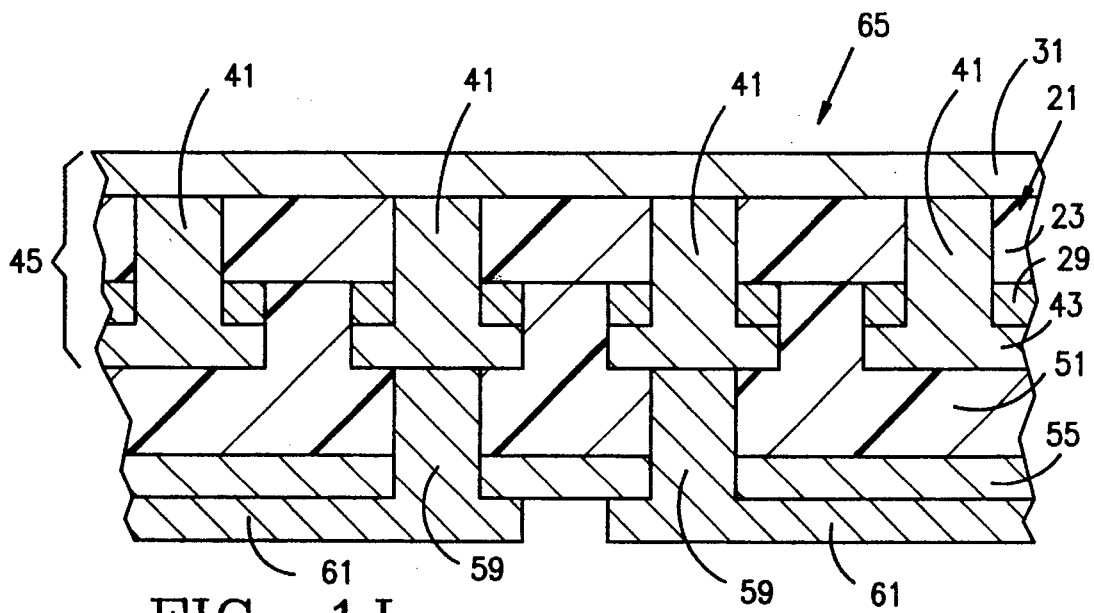

When the posts 59 reach the conductive material layer 55, the conductor and pad pattern 61 is electroplated over areas of the conductive material layer not covered by the photoimaged conductor and pad pattern. A protective layer (not shown) is electroplated over the conductor and pad pattern 61. The photoimaged conductor and pad pattern 61 is stripped. The conductive material layer 55, which was beneath the photoimaged conductor and pad pattern, is etched away leaving a patterned second sheet, as seen in FIG. 1J.

Figure 1K:
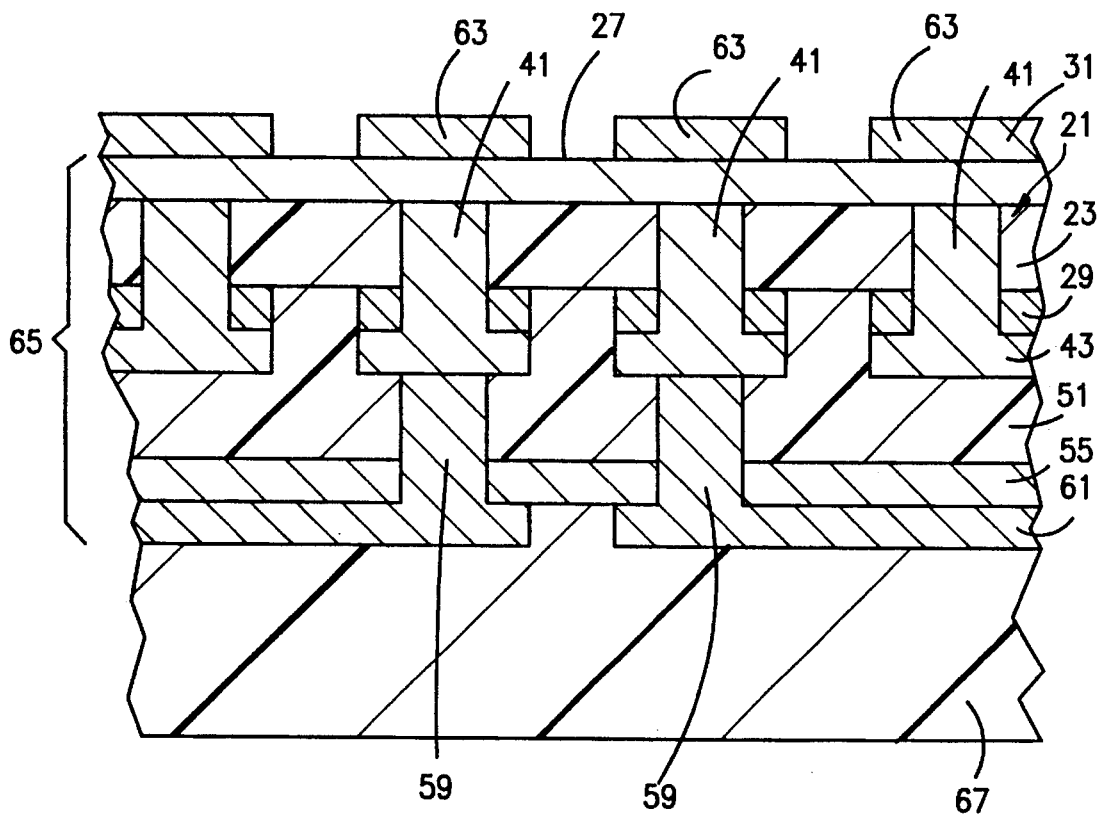

For each additional patterned conductive layer desired, the procedure described above is repeated. After all of the additional patterned conductive layers are formed, the second conductive layer 31 is patterned, e.g., by masking and etching, to form a conductor and pad pattern 63 as seen in FIG. 1K. The flexible, multilayer laminate 65 formed according to the preceding method is preferably bonded to a rigid board 67 which restricts the laminate from moving due to thermal expansion and bending. The rigid board 67 may be a material such as aluminum, ceramics, or a carbon/carbon composite and preferably acts as a heat sink.

Figure 2A:
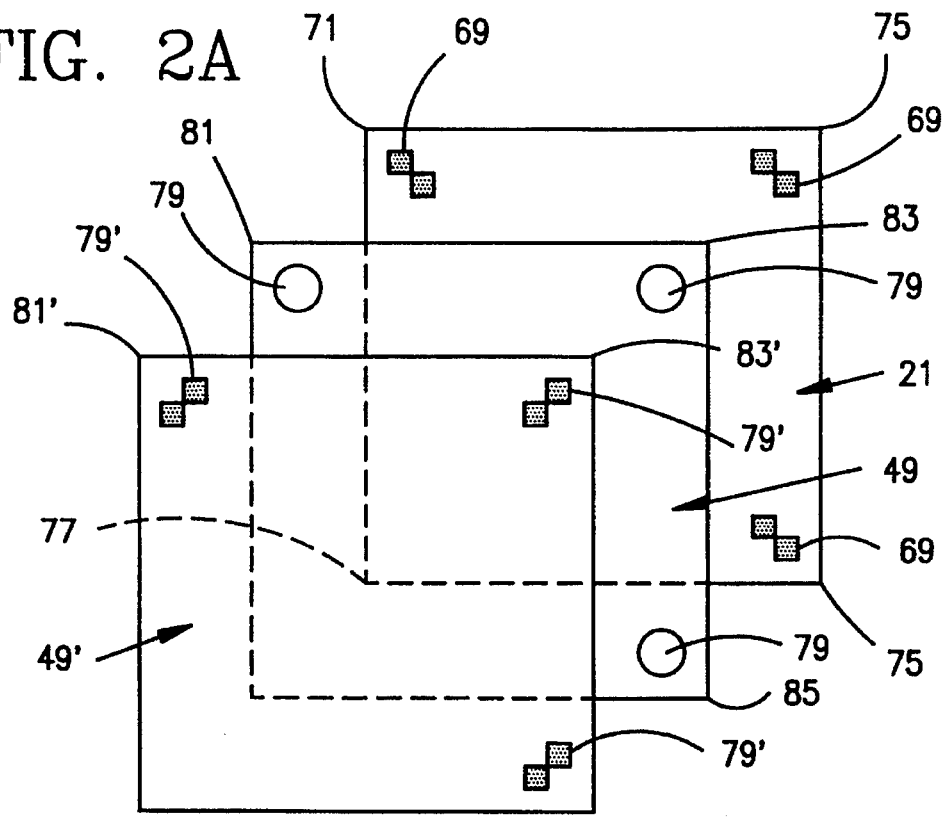
FIGS. 2A and 2B are schematic, exploded perspective views and assembled top plan views, respectively, of a pair of sheets for a laminate for a multilayer printed wiring board according to an embodiment of the present invention.

In attaching second and subsequent sheets to the patterned first sheet 45, it is necessary to properly align the sheets relative to one another. According to the present invention, alignment of the sheets is preferably accomplished with the use of a fiducial system on the sheets and artwork for the sheets. As seen in FIG. 2A, the first sheet 21, preferably formed of flex dielectric material with copper on sides thereof, and having a circuit pattern on one side of the sheet, is preferably provided with a fiducial 69 at each of three corners 71, 73, and 75 of the first sheet. The fiducials 69 are preferably in the form of two diagonally arranged squares. The fiducials 69 are preferably etched at the three corners 71, 73, and 75 at the same time as the circuit pattern. No fiducial is provided at a fourth corner 77 of the first sheet 21.

The second sheet 49, preferably a flex dielectric material having copper on one side thereof, has clearance windows 79 drilled in three corners 81, 83, and 85 corresponding to the corners 71, 73, and 75 of the first sheet 21, at the same locations as the fiducials 69. When the second sheet 49 is laminated to the first sheet 21, the clearance windows 79 are positioned to permit visibility of the fiducials 69 on the first sheet.

Figure 2B:
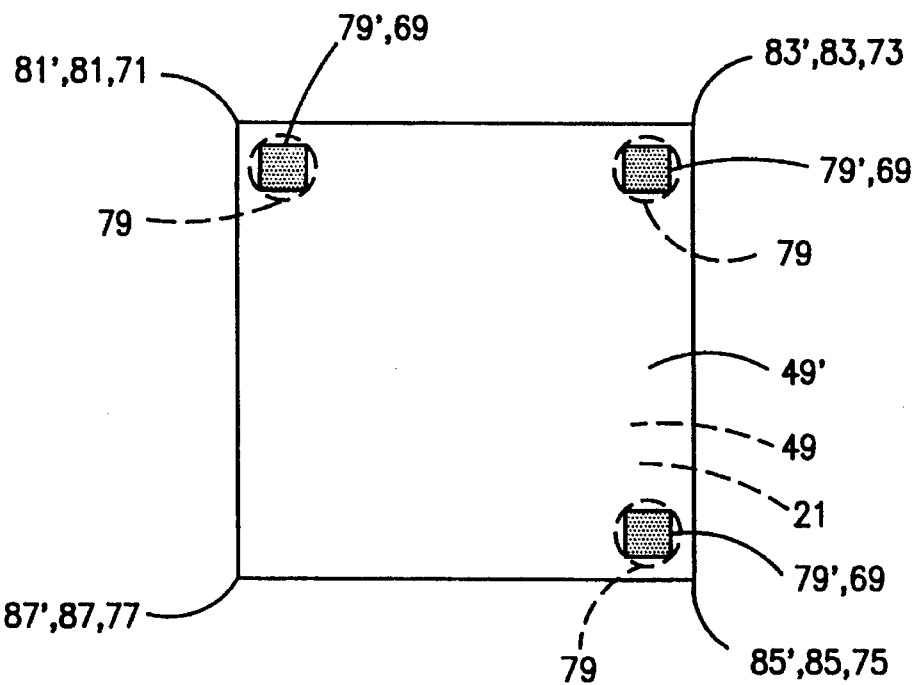

Artwork 49' for the second sheet 49 is provided with alignment fiducials 79' at three corners 81', 83', and 85' corresponding to the corners 71, 73, and 75 of the first sheet 21 and the corners 81, 83, and 85 of the second sheet. The fiducials 79' are preferably in the form of diagonally arranged squares, diagonals of the squares being arranged on a line perpendicular to diagonals of the squares of the fiducials 69 such that, when the fiducials on the artwork and the fiducials on the first sheet are aligned, as seen in FIG. 2B, they form a perfect square.

All further sheets of flex dielectric material having copper on one side thereof that are laminated over the second or subsequent sheets are also provided with clearance windows, laminated, and imaged in the same fashion as the second sheet 49. The fiducials of the first sheet 21 remain visible throughout the entire multilayer fabrication process.

A similar process is followed to pattern the second conductive layer 31 of the first sheet 21. Clearance windows are etched through the conductive layer 31 at the site of the fiducials 69 so that the fiducials are visible through the layer 23. Fiducials on the artwork for the circuit pattern to be formed on the conductive layer 31 is aligned with the fiducials 69 in the same fashion as for the second sheet 49 and subsequent sheets, described above. Accordingly, all layers are registered to the pattern of fiducials 69 on the first sheet 21.

Figure 3:
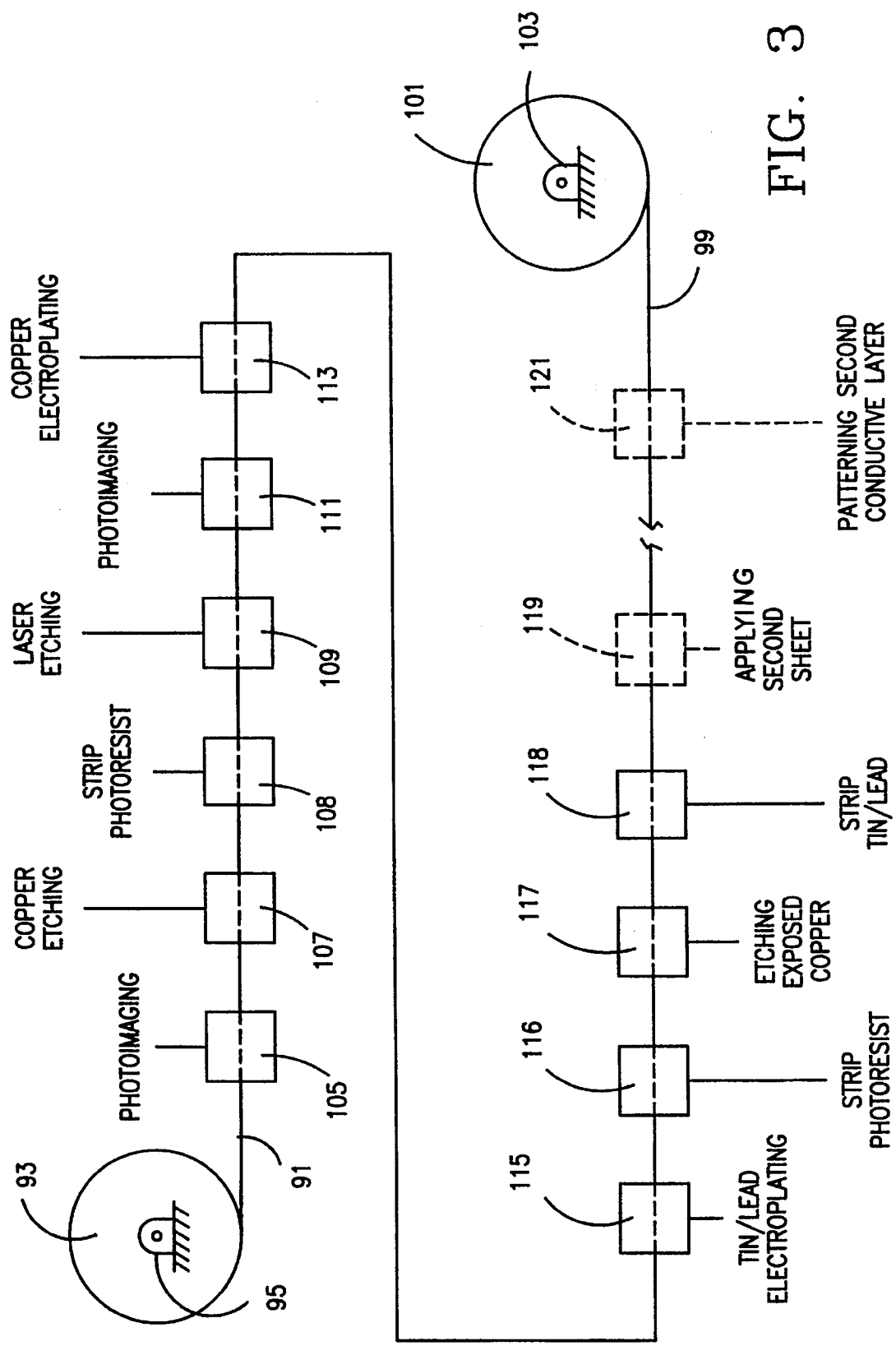
FIG. 3 is a schematic side view of an apparatus for making a multilayer laminate for a printed wiring board according to an embodiment of the present invention.

The steps for forming a patterned first sheet 45 and, if desired, the steps for bonding and patterning second and subsequent sheets to the patterned first sheet and patterning the second conductive layer 31, are preferably conducted in a substantially continuous reel to reel process. As seen in FIG. 3, the first sheet is preferably a portion of material 91 which is preferably wound into a roll 93 on a reel 95. The material 91 is unwound from the roll 93 and is incrementally advanced through a system 97 including various stations for forming the patterned first sheet 45.

After forming the patterned first sheet 45, or after applying or applying and patterning a second sheet 49, or after applying and patterning a second sheet and subsequent sheets, a resulting laminate 99, attached end to end to other laminates 99 formed with the material 91, is preferably wound into a roll 101 on another reel 103. The reel 103 preferably incrementally advances the material 91 from station to station in the system 97, although other well known and, preferably, more precise equipment may be used to advance the material, with or without the aid of the reel. The laminates 99 are cut from the roll 101 as required and a rigid board 67 is preferably applied to the cut laminates 99 (not shown in FIG. 3).

In laminating the second sheet 49 to a patterned first sheet 45, the patterned first sheet is preferably unwound from a first reel of material and the second sheet is preferably unwound from a second reel of material. The portions of the reeled material to be laminated together are positioned between press platens and laminated together. The press is opened and a next section is moved between the press platens for lamination, and so on until the first and second reels of material are completely laminated together. A single reel is used to remove the laminated product from between the platens. Clearance windows in the second sheets from the second reel of material are large enough to allow automated alignment of the second sheets to the first patterned sheets 45 from the first reel so that the fiducials 69 on the first patterned sheets are revealed.

The system 97 shown in FIG. 3 is described in connection with copper conductive material layers, copper posts, copper conductor and pad patterns, and tin/lead protective material, although it is understood that other materials may be used instead of copper and tin/lead. The system 97 includes a photoimaging station 105 at which photoimaged blind via sites 33 (FIG. 1A) are developed on a portion of the material 91 forming the first sheet 21. From the photoimaging station 105, the first sheet 21 is advanced to a copper etching station 107 at which the copper first conductive layer 29 is etched to form parts of the blind via sites 37 (FIG. 1B). From the copper etching station 107, the first sheet 21 is advanced to a photoresist stripping station 108 at which the photoresist is stripped from the first sheet.

The partially etched first sheet 21 is then advanced to a laser ablating station 109 at which the dielectric layer 23 is ablated, preferably by a scanning laser, to form the blind via sites 37 extending to the copper second conductive layer 31 (FIG. 1C). The first sheet 21 in which the blind via sites 37 are etched is then advanced to a photoimaging station 111 at which the photoimaged conductor and pad pattern 39 is developed on the copper first conductive layer 29 (FIG. 1D). Next, the first sheet 21 is advanced to a copper electroplating station 113 at which the posts 41 are electroplated, using the copper second conductive layer as an electrode (FIG. 1E), and thereafter the copper conductor and pad pattern 43 is electroplated (FIG. 1F).

The first sheet 21 on which the copper conductor and pad pattern 43 is electroplated is then advanced to a tin/lead electroplating station 115 at which the tin/lead protective material is electroplated on the copper conductor and pad pattern 43. The first sheet 21 including the copper conductor and pad pattern 43 and the tin/lead protective material is advanced to a station 116 at which the photoresist is removed. The first sheet 21 including the copper conductor and pad pattern 43 and the tin/lead protective material is advanced to a station 117 at which the photoimaged conductor and pad pattern 39 and exposed copper from the copper first conductive layer 29 beneath the photoimaged conductor and pad pattern are etched away, leaving the patterned first sheet 45 (FIG. 16). The patterned first sheet 45 is then advanced to a station 118 at which the tin/lead is removed from the patterned first sheet 45.

At this point in the system 97, the patterned first sheet 45 may be rewound into the roll 101 on the reel 103 or a second sheet 49 may be applied to the patterned first sheet at another station 119, as discussed above. If a second sheet 49 or a subsequent sheet is applied to the patterned first sheet 45 or a patterned laminate 99, the second sheet 49 or subsequent sheet may be processed in further stations similar to the stations 105, 107, 108, 109, 111, 113, 115, 116, 117, and described above. A further station or stations 121 may be provided for patterning the second layer 31 of conductive material.

While this invention has been illustrated and described in accordance with a preferred embodiment, it is recognized that variations and changes may be made therein without departing from the invention as set forth in the claims.

What is claimed is:

1. A method of fabricating a multilayer laminate for a printed wiring board, comprising, in order, the steps of:

a. developing, with photoimaging material, a photoimage of a plurality of blind via sites on a first side of a first sheet, the first sheet including a flexible dielectric material, the flexible material being clad on the first and a second side with first and second layers of conductive material, respectively;

b. etching conductive material of the first layer of conductive material from the blind via sites;

c. removing developed photoimaging material of the photoimage of the blind via sites;

d. laser ablating the flexible material from the blind via sites;

e. developing, with photoimaging material, a photoimage of a conductor and pad pattern on the first side of the first sheet;

f. electroplating conductive material posts in the blind via sites, using the second layer of conductive material as an electrode;

g. electroplating conductive material in the conductor and pad pattern on the first side of the first sheet;

h. electroplating a protective material in the conductor and pad pattern over the conductive material electroplated in the conductor and pad pattern on the first side of the first sheet;

i. removing developed photoimaging material of the photoimage of the conductor and pad pattern;

j. etching the first side of the first sheet to remove the photoimaged pattern and exposed conductive material of the first layer of conductive material beneath the photoimaged pattern, thereby forming a patterned first sheet;

k. removing the protective material; and l. repeating steps of bonding a first side of a second sheet, the second sheet including a flexible material clad on a second side with a first layer of conductive material, to an etched first side of a preceding sheet, followed by steps a–k for each additional layer of conductive material desired, thereby forming the multilayer laminate.

2. The method as set forth in claim 1, comprising the further step of etching the second layer of conductive material on the second side of the first sheet to form a circuit pattern.

3. The method as set forth in claim 1, comprising the further step of laminating a side of the multilayer laminate opposite the second side of the first sheet to a rigid board.

4. The method as set forth in claim 1, comprising the further step of laminating a side of the multilayer laminate opposite the second side of the first sheet to a heat sink.

5. The method as set forth in claim 1, wherein the first sheet is a portion of a roll of sheet material, the method comprising the further step of, prior to photoimaging the plurality of blind via sites, unreeling the first sheet from the roll of sheet material.

6. The method as set forth in claim 5, comprising the further steps of incrementally advancing the unreeled first sheet through a plurality of stations, and performing each of the steps a–h at corresponding ones of the stations.

7. The method as set forth in claim 6, comprising the further step of performing step 1 at corresponding ones of the stations.

8. The method as set forth in claim 7, comprising the further step of rewinding the first sheet into a second roll after performing the steps a–l.

9. The method as set forth in claim 6, comprising the further step of rewinding the first sheet into a second roll after performing the steps a–k.

10. The method as set forth in claim 9, comprising the further steps of unreeling the patterned first sheet from the second roll and performing step 1.

11. The method as set forth in claim 10, wherein, when step 1 is performed, the multilayer laminate is rewound into a roll after every application of a new layer of conductive material.

12. The method as set forth in claim 1, wherein laser ablating of the flexible material from the blind via sites is performed with a scanning laser.

13. The method as set forth in claim 1, wherein the first sheet is provided with a first fiducial at three corners thereof, the second sheet is provided with a clearance window at three corners thereof, and artwork for the second sheet is provided with a second fiducial at three corners thereof, the three corners of the second sheet and the three corners of the artwork corresponding to the three corners of the first sheet, the method comprising the further step of aligning the first sheet relative to the second sheet by aligning the first fiducials and the clearance windows such that the first fiducials are visible through the clearance windows, and then aligning the first fiducials and the second fiducials.

14. The method as set forth in claim 1, wherein the conductive material is copper.

15. The method as set forth in claim 1, wherein the protective material is a tin/lead material.

16. The method as set forth in claim 1, wherein the flexible material is polyimide.

17. A method of fabricating a multilayer laminate for a printed wiring board, comprising the steps of:

etching a plurality of blind via sites from a first side of a first sheet, the first sheet including a flexible dielectric material, the flexible material being clad on the first and a second side with first and second layers of conductive material, respectively, through the first conductive material and the flexible material to the second conductive material; and electroplating conductive material posts in the blind via sites, using the second layer of conductive material as an electrode.

18. The method as set forth in claim 17, comprising the further steps of forming a conductor and pad pattern on the first side of first sheet by developing, with a photoimaging material, a photoimage of the conductor and pad pattern on the first side of the sheet, electroplating conductive material in the conductor and pad pattern on the first side of the first sheet, electroplating a protective material in the conductor and pad pattern over the conductive material electroplated in the conductor and pad pattern on the first side of the first sheet, removing developed photoimaging material of the photoimage of the conductor and pad pattern, etching the first side of the first sheet to remove the photoimaged pattern and exposed conductive material of the first layer of conductive material beneath the photoimaged pattern, thereby forming a patterned first sheet.

19. The method as set forth in claim 18, comprising the further steps of repeating, for each additional layer of conductive material desired, a step of bonding a first side of a second sheet, the second sheet including a flexible material clad on a second side with a first layer of conductive material, to the etched first side of a preceding sheet, followed by steps of etching a plurality of blind via sites through the second sheet, electroplating conductive material posts in the blind via sites, and forming a conductor and pad pattern on the second sheet.

20. The method as set forth in claim 19, wherein the first sheet is a portion of a roll of sheet material, the method comprising the further step of, prior to developing the photoimage of the plurality of blind via sites, unreeling the first sheet from the roll of sheet material.

21. The method as set forth in claim 20, comprising the further steps of incrementally advancing the unreeled first sheet through a plurality of stations, and performing the step of etching a plurality of blind via sites, the step of electroplating conductive material posts in the blind via sites, the step of forming a conductor and pad pattern on the first side of first sheet, and the step of repeating, for each additional layer of conductive material desired, bonding a second sheet to the etched first side of a preceding sheet, followed by steps of etching a plurality of blind via sites through the second sheet, electroplating conductive material posts in the blind via sites, and forming a conductor and pad pattern on the second sheet at corresponding ones of the stations.

22. The method as set forth in claim 17, wherein the first sheet is a portion of a roll of sheet material, the method comprising the further step of, prior to developing the photoimage of the plurality of blind via sites, unreeling the first sheet from the roll of sheet material.

23. The method as set forth in claim 22, comprising the further steps of incrementally advancing the unreeled first sheet through a plurality of stations, and performing the step of etching a plurality of blind via sites and the step of electroplating conductive material posts in the blind via sites at corresponding ones of the stations.

24. A system for fabricating a multilayer laminate for a printed wiring board, comprising:

a. means for forming a photoimage of a plurality of blind via sites on a first side of a first sheet, the first sheet including a flexible dielectric material, the flexible material being clad on the first and a second side with first and second layers of conductive material, respectively;

b. means for etching conductive material from the blind via sites;

c. a laser for ablating the flexible material from the blind via sites;

d. means for forming a photoimage of a conductor and pad pattern on the first side of the first sheet after laser etching;

e. means for electroplating conductive material posts in the blind via sites after laser etching, using the second layer of conductive material as an electrode, and for electroplating conductive material in the conductor and pad pattern on the first side of the first sheet after electroplating the conductive material posts;

f. means for electroplating a protective material in the conductor and pad pattern over the conductive material electroplated in the conductor and pad pattern on the first side of the first sheet; and g. means for etching the first side of the first sheet to remove the photoimaged pattern and exposed conductive material of the first layer of conductive material beneath the photoimaged pattern, thereby forming a patterned first sheet.

25. The system as set forth in claim 24, wherein the first sheet is a portion of a roll of first sheet material, the apparatus further comprising a first reel for supporting the roll of first sheet material, and unreeling means for unreeling the roll of first sheet material and incrementally advancing the first sheet for processing.

26. The system as set forth in claim 25, wherein the unreeling means includes a second reel, the second reel being rotatable such that the second reel winds a plurality of patterned first sheets into a roll.

27. The system as set forth in claim 24, further comprising means for bonding a first side of a second sheet, the second sheet including a flexible material clad on a second side with a first layer of conductive material, to an etched first side of the first sheet.

28. A system for fabricating a multilayer laminate for a printed wiring board, comprising:

a. means for forming a photoimage of a plurality of blind via sites on a first side of a first sheet, the first sheet including a flexible dielectric material, the flexible material being clad on the first and a second side with first and second layers of conductive material, respectively;

b. means for etching conductive material from the blind via sites;

c. means for laser ablating the flexible material from the blind via sites; and d. means for electroplating conductive material posts in the blind via sites after laser ablating, using the second layer of conductive material as an electrode.

29. The system as set forth in claim 28, wherein the first sheet is a portion of a roll of first sheet material, the apparatus further comprising a first reel for supporting the roll of first sheet material, and unreeling means for unreeling the roll of first sheet material and incrementally advancing the first sheet for processing.

* * * * *

UNITED STATES PATENT AND TRADEMARK OFFICE
CERTIFICATE OF CORRECTION

| | | |
|---|---|---|
| PATENT NO. | : | 5,567,329 |
| DATED | : | October 22, 1996 |
| INVENTOR(S) | : | Paul B. Rose, et al. |

It is certified that error appears in the above-indentified patent and that said Letters Patent is hereby corrected as shown below:

Column 4, line 37, delete "enchant" and insert --etchant--.

Column 4, line 38, please delete "enchant", and insert therefore --etchant--.

Column 7, line 56, please delete "16", and insert therefore --1G--.

Signed and Sealed this

Twentieth Day of May, 1997

*Attest:*

BRUCE LEHMAN

*Attesting Officer*  Commissioner of Patents and Trademarks